(12) United States Patent  
Shi

(10) Patent No.: US 10,481,427 B2  
(45) Date of Patent: Nov. 19, 2019

(54) ARRAY SUBSTRATE, MANUFACTURING METHOD, DISPLAY PANEL AND ELECTRONIC DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Dawei Shi, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 106 days.

(21) Appl. No.: 15/541,813

(22) PCT Filed: Jan. 10, 2017

(86) PCT No.: PCT/CN2017/070743  
§ 371 (c)(1),  
(2) Date: Jul. 6, 2017

(87) PCT Pub. No.: WO2017/177734  
PCT Pub. Date: Oct. 19, 2017

(65) Prior Publication Data  
US 2018/0107053 A1 Apr. 19, 2018

(30) Foreign Application Priority Data  
Apr. 14, 2016 (CN) .......................... 2016 1 0232297

(51) Int. Cl.  
*G02F 1/1362* (2006.01)  
*G02F 1/1335* (2006.01)  
*G06F 3/041* (2006.01)

(52) U.S. Cl.  
CPC .. *G02F 1/133514* (2013.01); *G02F 1/136209* (2013.01); *G06F 3/0412* (2013.01);  
(Continued)

(58) Field of Classification Search  
CPC ......... G02F 1/136204; G02F 1/136209; G02F 2001/136218; G02F 2001/134318;  
(Continued)

(56) References Cited

U.S. PATENT DOCUMENTS

2011/0123729 A1 5/2011 Lee et al.  
2012/0313881 A1 12/2012 Ge et al.  
(Continued)

FOREIGN PATENT DOCUMENTS

CN 203883006 U 10/2014  
CN 104238222 A 12/2014  
(Continued)

OTHER PUBLICATIONS

The First Chinese Office Action dated Dec. 25, 2017; Appln. No. 201610232297.3.

(Continued)

*Primary Examiner* — Angela K Davison

(57) ABSTRACT

An array substrate, a manufacturing method, a display panel and an electronic device are provided. The array substrate includes a substrate, and a gate line, an insulation layer, an active layer and a data line which are formed on the substrate. The insulation layer is provided on the gate line, the data line is provided on the gate line through the insulation layer and is crossed with the gate line, and the active layer is provided between the gate line and the data line in a direction perpendicular to the substrate, and a first shield layer is provided on the gate line through the insulation layer, and the first shield layer covers the gate line in the direction perpendicular to the substrate and is electrically (Continued)

insulated from the gate line, the active layer and the data line.

15 Claims, 6 Drawing Sheets

(52) U.S. Cl.
CPC ............ *G02F 2001/136218* (2013.01); *G06F 2203/04103* (2013.01)

(58) Field of Classification Search
CPC ....... G02F 2001/136295; G06F 3/0412; G06F 2203/04103; G06F 2203/04107; H01L 27/02; H01L 27/1259; G09G 2330/06
See application file for complete search history.

(56) References Cited

U.S. PATENT DOCUMENTS

| | | | |
|---|---|---|---|
| 2015/0060863 A1* | 3/2015 | Li | H01L 27/124 257/71 |
| 2015/0187750 A1* | 7/2015 | Kim | H01L 27/0248 257/43 |
| 2015/0279835 A1* | 10/2015 | Moriwaki | H01L 27/0266 257/72 |
| 2015/0364500 A1 | 12/2015 | Cheng et al. | |
| 2016/0190178 A1 | 6/2016 | Ding et al. | |
| 2016/0320650 A1* | 11/2016 | Ding | G02F 1/13338 |

FOREIGN PATENT DOCUMENTS

| | | |
|---|---|---|
| CN | 104597670 A | 5/2015 |
| CN | 104808885 A | 7/2015 |
| CN | 105867692 A | 8/2016 |

OTHER PUBLICATIONS

International Search Report and Written Opinion dated Apr. 6, 2017; PCT/CN2017/070743.

Extended European Search Report dated Sep. 25, 2019; Appln. No. 17781712.9.

* cited by examiner

ARRAY SUBSTRATE, MANUFACTURING METHOD, DISPLAY PANEL AND ELECTRONIC DEVICE

TECHNICAL FIELD

Embodiments of the present disclosure relates to an array substrate, a manufacturing method of the array substrate, a display panel and an electronic device.

BACKGROUND

With population of the touch control device, touch display panels are more popular. In a touch display panel, a common electrode layer is cut into stripes, and the striped common electrodes are configured to touch driving electrodes. However, in this case, signal lines under gaps between striped common electrodes cannot be shielded, so that electric field produced from the signal lines will affect displaying of the display panel.

SUMMARY

An embodiment of the disclosure provides an array substrate, comprising a substrate, and a gate line, an insulation layer, an active layer and a data line which are formed on the substrate, wherein the insulation layer is provided on the gate line, the data line is provided on the gate line through the insulation layer and is crossed with the gate line, and the active layer is provided between the gate line and the data line in a direction perpendicular to the substrate, and a first shield layer is provided on the gate line through the insulation layer, and the first shield layer covers the gate line in the direction perpendicular to the substrate and is electrically insulated from the gate line, the active layer and the data line.

An embodiment of the disclosure provides manufacturing method of an array substrate, the array substrate comprising a substrate and a gate line, an insulation layer, an active layer, a data line provided on the substrate, the manufacturing method comprising: forming the gate line, the insulation layer, the active layer, and the data line on the substrate in sequence in a direction far away from the substrate, and forming a first shield layer above the gate line through the insulation layer, wherein the gate line and the data line are crossed with each other, and the first shield layer covers the gate line in a direction perpendicular to the array substrate, and is electrically insulated from the gate line, the active layer and the data line.

An embodiment of the disclosure provides a display panel comprising the above mentioned array substrate.

An embodiment of the disclosure provides an electronic device comprising the above mentioned display panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1A:
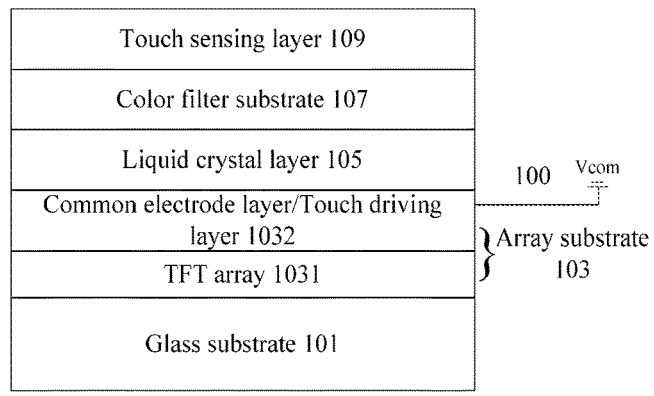
FIG. 1a is a structural schematic diagram of a exemplary touch display panel.

FIG. 1a illustrates a structure of an exemplary touch display panel 100. In the touch display panel 100, an array substrate 103 is provided on a glass substrate 101, and the array substrate 103 further comprises a TFT array 1031 and a common electrode layer 1032. A common power source applies a voltage Vcom to the common electrode layer 1032. For example, the common power source can be a conductive part which is electrically connected with a external common power source on the array substrate. In operation, the external common power source can supply the common voltage to other parts (for example, common electrodes etc.) by the common power source on the array substrate. A liquid crystal layer 105, a color film substrate 107 and a touch sensing layer 109 are sequentially provided on the array substrate 103. The common electrode layer 1032 on the array substrate 103 is cut into stripes, so that the striped common electrodes are used as touch driving electrodes. That is, the common electrode layer 1032 is used as touch driving electrode layer 1032 at the same time. A touch position can be detected by touch sensing electrodes and touch driving electrodes.

Figure 1B:
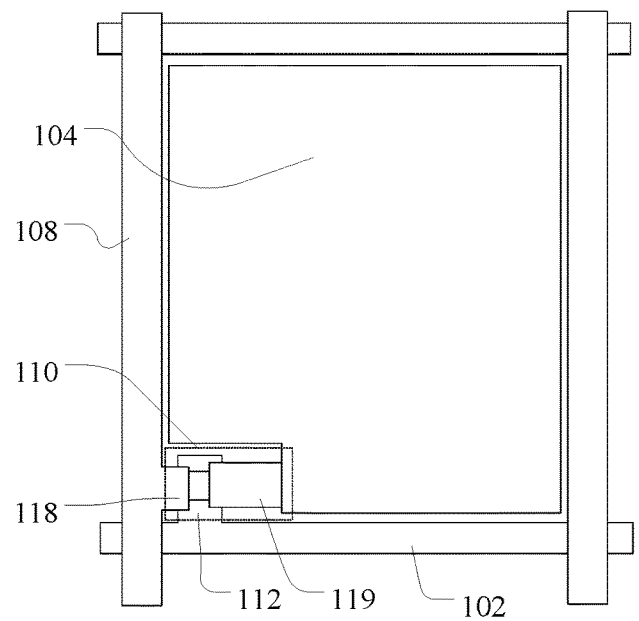
FIG. 1b is a top view of an exemplary TFT array.

FIG. 1b is a schematic diagram of the TFT array 1031. As illustrated in FIG. 1b, the TFT array substrate 1031 generally comprises a plurality of gate lines 102 and a plurality of data lines 108. The gate lines 102 and the data lines 108 are crossed to define sub pixel units arranged in an array (FIG. 1b only particularly illustrates a sub pixel unit as an example), and each sub pixel unit comprises a thin film transistor 110 functioned as a switch element and a pixel electrode 104 to control arrangement of the crystal liquid. Generally, each sub pixel unit can further comprise a common electrode layer (not illustrated in FIG. 1b) which is cooperated with the pixel electrode 104 to form the electric field to drive the liquid crystal. The common electrode layer 1032 generally covers the TFT array 1031, as illustrated in FIG. 1a. For example, in each sub pixel unit, a gate electrode 112 of the thin film transistor 110 is electrically connected with a corresponding gate line 108 (for example, both of them are formed integrally), a source electrode 118 is electrically connected with a corresponding data line 108 (for example, both of them are formed integrally), and a drain electrode 119 is electrically connected with a corresponding pixel electrode 104 (for example, both of them are formed integrally, and also can be form with different materials).

Figure 1C:
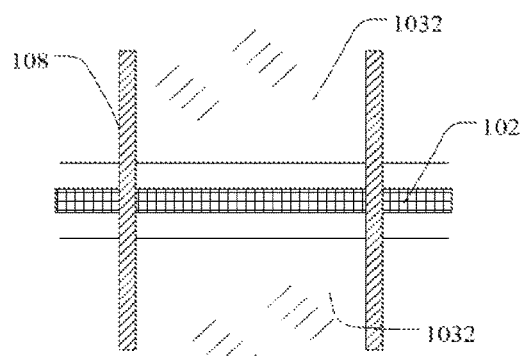
FIG. 1c is a top view illustrating a position relationship of striped common electrodes and a gat line.

In order to achieve a function of touch displaying, touch driving electrodes and touch sensing electrodes are further required to provide to the display panel 100. In the example of FIG. 1a, the common electrode layer 1032 on the array substrate 103 is cut into stripes and the striped common electrodes are used as touch driving electrodes. FIG. 1c is a top view illustrating a position relationship of the striped common sub-electrodes and the gate line. As illustrated in FIG. 1c, a gate line 102 is located at a projection of a gap between adjacent striped common sub-electrodes. That is, the gate line is not covered by striped common sub-electrodes seen from a direction perpendicular to the array substrate 201. It should be noted that, in a whole array substrate 103, a plurality of gate lines can be located at projections of gaps of a plurality of adjacent striped common sub-electrodes, and a gate line or one or more gate lines can be covered by the striped common sub-electrodes at the same time.

In the disclosure, a first structure covers a second structure, which means a projection of the first structure in a perpendicular direction covers a projection of the second structure in the perpendicular direction.

In study, the inventor of the disclosure noticed the following problem. The gate lines are used to receive scan signals, and thus the gate lines generally have a higher voltage. In the structure of FIG. 1c, because the common electrode layer 1032 is cut into stripes so that one gate line or a plurality of gate lines are not covered by common sub-electrodes, the striped common sub-electrodes cannot shield strong electric fields produced from the gate line or the plurality of gate lines. The electric fields produced from the gate line or the plurality of gate lines can make orientation electric fields for the liquid crystal layer abnormal, which affects orientation of molecules of the liquid crystal, resulting in light intensity variation and producing black stripes in displaying.

In the embodiments of the disclosure, a shied layer covers gate lines located at gaps between the striped common sub-electrodes, so that electric fields produced from the above mentioned gate lines can be weakened or even shielded, so as to eliminate poor displaying. It should be noted that, embodiments of the disclosure are not limited to cover a shield layer above the gate lines at the gaps between the striped common sub-electrodes. Even though a whole common electrode layer covers the gate lines, the embodiment of the disclosure also can be adopted to further shield electric fields produced from the gate lines.

Figure 2A:
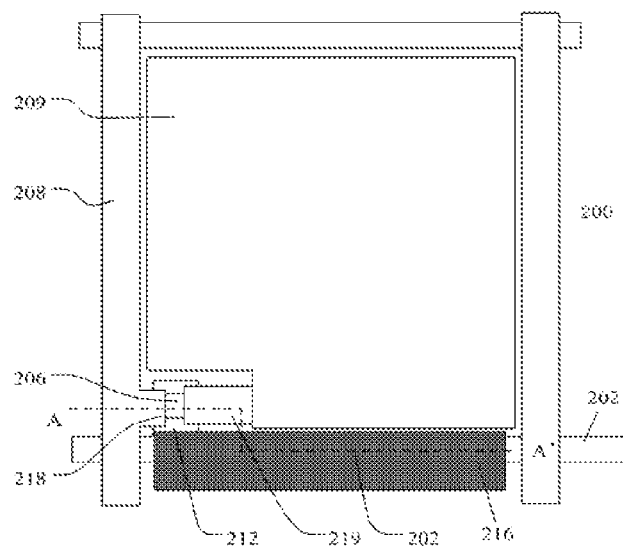
FIG. 2a is a top view of an array substrate provided by an embodiment of the disclosure.
Figure 2B:
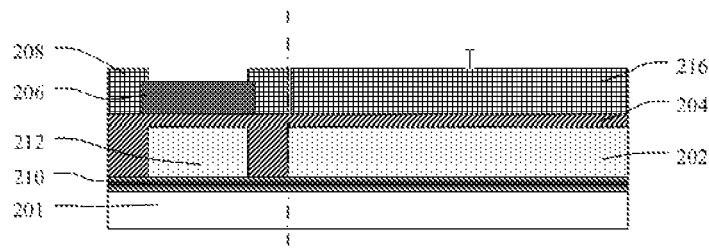
FIG. 2b is a cross-section view of the array substrate of FIG. 2a along line A-A'.

Refer to FIGS. 2a and 2b, FIGS. 2a and 2b illustrate schematic diagrams of the array substrate provided by an embodiment of the disclosure. The array substrate 200 comprises a substrate 201, gate lines 202 provided on the substrate 201, an insulation layer 204 (not illustrated in FIG. 2a) provided on the gate lines 202, data lines 208 provided on the gate lines 202 through the insulation layer 204 and crossed with the gate lines 202, an active layer 206 provided on the gate line 202 and a shield layer 216 provided in a same layer as the data line 208. In the embodiment, in order to simplify process, the shield layer 216 can be made of a same material as the data line 208, and can be provided in a same layer as the data line 208 by one time process. A thickness of the shield layer 216 can be the same as that of the data line, for example, 4000~5000 Å. Those skilled in related arts should appreciate that the material of the shield layer 216 can be other metal or non-metal material, provided that the shield layer can weaken or shield electric fields. The shield layer 216 covers the gate line 202 in a direction perpendicular to the array substrate 200 and is electrically insulated from the gate line 202, the active layer 206 and the data line 208. A particular manufacturing method of the shield layer will be detailed as follows. Because the shied layer 216 which is made of a same material as the data line 206 has a conductive ability, the electric fields produced from the gate line will be weakened, or even shielded according to a principle of a conductor having electric field shielding ability, to reduce the affect of the gate line to displaying.

FIG. 2b illustrates a cross-section of the array substrate 200 illustrated in FIG. 2a along line A-A'. As illustrated in FIG. 2b, the gate electrode 212 and the gate line 202 provided in a same layer as the gate electrode 212 are provided on the substrate 201, an insulation layer 204 is provided on the gate electrode 212 and the gate line 202, and an active layer 206 is provided on the gate electrode 212 through the insulation layer 204. The data line 208 (which comprises the source electrode and the drain electrode) is provided on the insulation layer. The array substrate 200 further comprises a light blocking layer 210 provided between the substrate 201 and the gate line 202. In the embodiment, the shield layer 216 is provided in a same layer as the data line 208, covers the gate line 202 in a direction perpendicular to the array substrate 200, and is electrically insulated from the gate line 202, the active layer 206 and the data line 208. For example, the insulation layer 206 is provided between the gate line 202 and the shield layer 216, which can insulate the gate line 202 form the shield layer 216. In addition, although the shield layer 216 adopts a same material as the data line 208 in the embodiment, the shield layer 216 and the data line 208 are not electrically connected with each other, to prevent signals of the data line 207 from affecting the shield layer 216. Similarly, the shield layer 216 and the active layer 216 are not electrically connected with each other, either. As can be seen from FIGS. 2a and 2b, the shield layer 216 which is additionally provided can at least partially cover the gate line 202, so that the electric field produced from scan signals of the gate line 202 can be shielded, so as not to disturb liquid crystal layer. "Cover" mentioned in the disclosure means at least partially overlapping. That is, the shield layer 216 can at least partially overlap with the gate line 202 in a direction perpendicular to the array substrate. In other words, the shield layer 216 can be narrower or wider than the gate line 202, but it is necessary to cover at least a portion of the gate line 202. Those skilled in related arts should note that, although the gate line locating at the gap between adjacent common electrodes is illustrated as an example, the shield layer also can be provided to cover the gate line to achieve a better electric field shield effect when the gate line is covered by the common electrode.

Figure 2C:
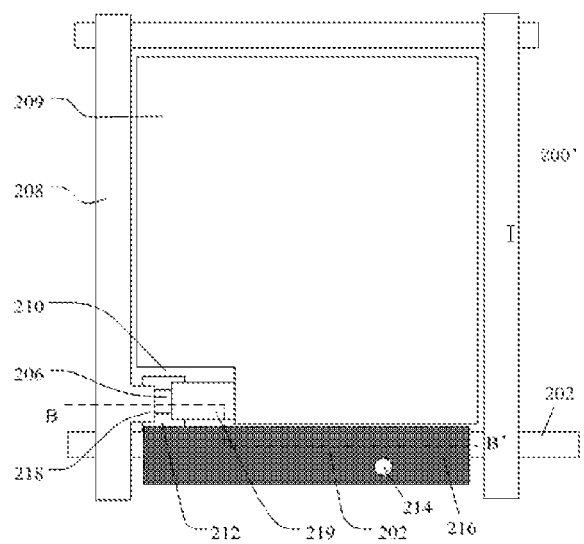
FIG. 2c is a top view of an array substrate provided by another embodiment of the disclosure.
Figure 5A:
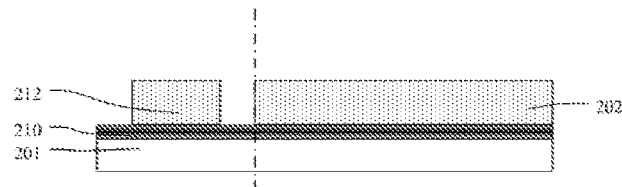
FIGS. 5a-5g are schematic diagrams of a manufacturing method of an array substrate provided by an embodiment of the disclosure.

FIG. 2c illustrates a schematic diagram of the array substrate 200' according to another embodiment of the disclosure. The array substrate 200' is different from the array substrate 200 in that. a via is further provided in the array substrate 200'. The via 214 is connected with the shield layer 216, so that the common power source applies the common voltage Vcom to the shield layer 216 by the via 216. In an example, the via 214 passes through an interlayer 222 (not illustrated) comprising an inter-level dielectric (ILD), polysilicon layer, and a buffer layer, and is ultimately connected to the light blocking layer 210 (made of molybdenum, for example) having a conductive ability. The common power source is connected to the light shield layer, so as to apply the common voltage Vcom to the shield layer 216 by the via 214. In another example, as illustrated in FIG. 5a, the via 214' which is connected to the shield layer 216 is formed by etching an auxiliary layer 220 (comprising a passivation layer or a planarization layer, for example). It should be noted that, a manner of applying the common voltage Vcom by the via can be designed under actual requirement, and is not limited to above examples. In this way, the shield layer 216 can have a same common voltage as the common electrode layer, to further shied electric fields produced by the scan signals which disturb the liquid crystal layer. At the same time, because the shield layer 216 only receives the common voltage, the common electrode layer would not apply touch control drive voltage to the shield layer 216 when it is used as the touch drive electrode layer, so as to avoid disturbing of the shield layer 216 to touch control operations in touch control phases.

Figure 3A:
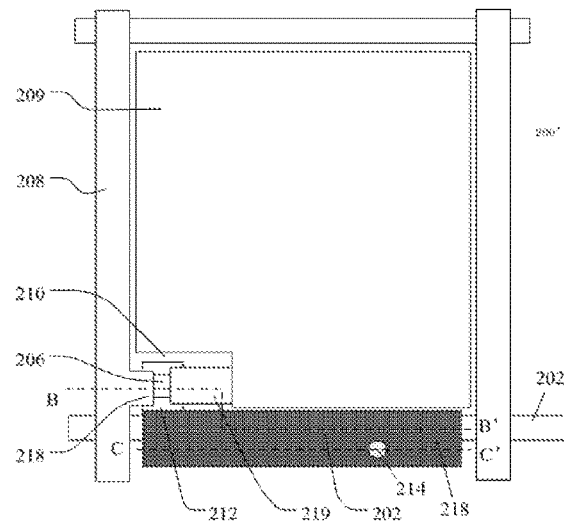
FIG. 3a is a top view of an array substrate provided by another embodiment of the disclosure.
Figure 3B:
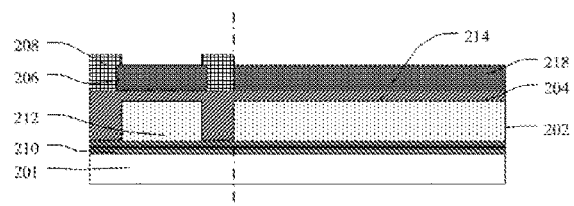
FIG. 3b is a cross-section view of the array substrate of FIG. 3a along line B-B'.
Figure 3C:
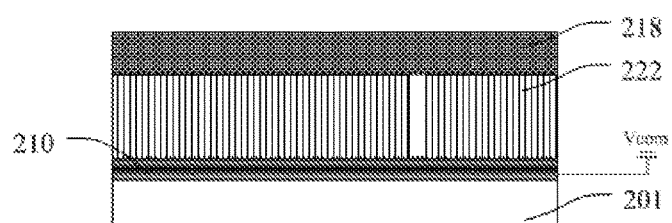
FIG. 3c is a cross-section view of the array substrate of FIG. 3a along line C-C'.
Figure 6A:
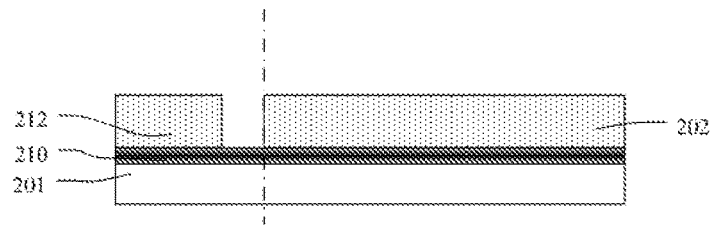
FIGS. 6a-6g are schematic diagrams of a manufacturing method of an array substrate provided by another embodiment of the disclosure.

FIG. 3a illustrates a schematic diagram of the array substrate 300 according to another embodiment of the disclosure. The array substrate 300 is different from the array substrate 200 illustrated in FIG. 2b in that, in the array substrate 300, the shield layer 218 is made of a same material as the active layer 206 and is provided in a same layer as the active layer 206. FIG. 3b is a cross-section of the substrate 300 of FIG. 3a along line B-B'. As illustrated in FIG. 3b, the shield layer 218 covers the gate line 202 in a direction perpendicular to the array substrate 300, and is electrically insulated from the gate line 202, the active layer 206 and the data line 208. Because the active layer is generally made of metal oxide semiconductor, it also can shield or weaken the electric fields. The shield layer also can adopt other metal or non-metal materials, provided that the shield layer 218 can weaken or shield the electric fields. The array substrate 300 also can have the via 214, so that the common power source can apply the common voltage Vcom to the shield layer 218 by the via 214. FIG. 3c is a cross-section diagram of the array substrate 300 of FIG. 3a along line C-C'. In an example, the via 214 passes through an inter-layer 222 comprising an inter-level dielectric (ILD), a polysilicon layer, and a buffer layer, and is ultimately connected to the light shield layer 210 (made of molybdenum, for example) with a conductive ability. The common power source is connected to the light shield layer, to apply the common voltage Vcom to the shield layer 218 by the via 214. A manner of the common power connecting to the light shield layer can be selected according to design requirement, for example, adopting pads or wires. This will not be described in detail in the disclosure. Meanwhile, the common voltage Vcom also can be applied to the shield layer in other manners. For example, in another example, as illustrated in FIG. 6a, the via 214' which is connected to the shield layer 218 is formed by etching an auxiliary layer 220 (comprising a passivation layer or a planarization layer, for example), so that the common voltage Vcom can be applied to the shield layer by the via 214'.

Figure 4:
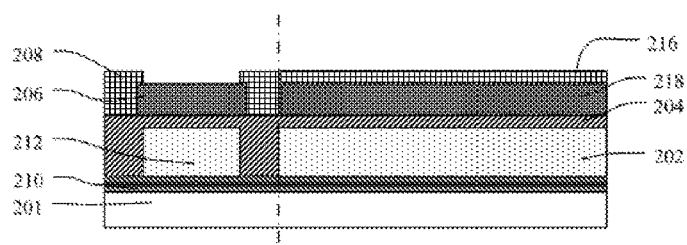
FIG. 4 is a cross-section view of an array substrate provided by another embodiment of the disclosure.

FIG. 4 illustrates a cross-section diagram of the array substrate 400 according to another embodiment of the disclosure. The array substrate 400 is different from the array substrate 200 illustrated in FIG. 2b in that, a shield layer 218 similar to the embodiment illustrated in FIG. 3a is provided on the basis of providing the shield layer 216 in the array substrate 400. Therefore, electric fields are shielded effectively by providing both of the shield layers 216 and 218. In addition, because the shield layer 218 is made of metal oxide semiconductors, the shield layer 216 is protected by the shield layer 218 from being oxidized by providing the shield layers 216 and 218. Similar to the embodiments illustrated in FIGS. 2 and 3, the array substrate 400 can have a via, so that the common power source can apply the common voltage Vcom to the shield layers 216 and 218 by the via.

In the above embodiments, material of the shield layers can be the same as that of the data lines or the active layer. However, those skilled in related arts should know that other materials which can weaken or shield electric fields also can be adopted by the shield layers. Furthermore, the above embodiments are only examples of providing shield layer, and the shield layers also can be provided in a different layer from the data lines or the active layer.

Another embodiment of the disclosure provides a manufacturing method of an array substrate. The array substrate comprises a substrate, and gate lines, an insulation layer, an active layer and data lines which are provided on the substrate. The manufacturing method comprises: forming the gate lines, the insulation layer, the active layer, the data lines, on the substrate in a direction away from the substrate, and forming a first shield layer above the gate lines through the insulation layer. The gate lines and the data lines are crossed with each other, and the first shield layer covers the gate lines in a direction perpendicular to the array substrate, and is electrically insulated from the gate lines, the active layer and the data lines.

In the manufacturing method of the array substrate, the above mentioned gate lines, insulation layer, active layer, data lines and common electrode layer can be formed by different patterning processes, for example. In the following embodiment, a manufacturing method of the array substrate 200 is illustrated as an example. The manufacturing method comprises steps S11-S14.

In S11, as illustrated in FIG. 5a, a light blocking layer 210 and a gate metal layer comprising a gate line 202 are formed on the substrate 201.

For example, a gate metal layer film is formed by a sputtering process on the substrate 201 (for example, a glass substrate, a plastic substrate or a quartz substrate), and then, gate lines are formed through a mask by one exposure, developing and wet etching process, for example. For instance, the gate metal layer can be alloy adopting one or more of Cr, Mo, Al, Cu, etc.

In this step, the gate electrode 212 also can be formed in the gate metal layer.

Figure 5B:
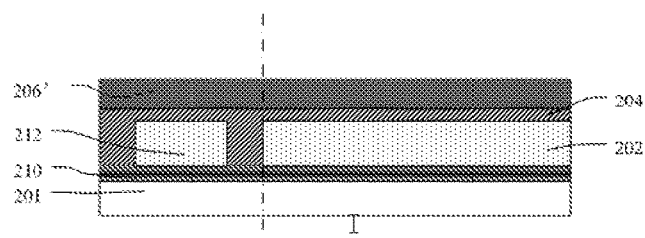
Figure 5C:
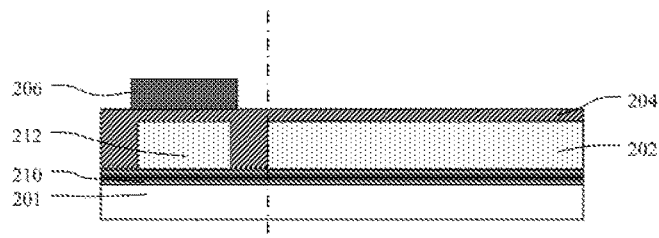

In S12: as illustrated in FIG. 5b, the insulation layer 204 and the active layer film 206' are formed on the gate line 202; and then, as illustrated in FIG. 5c, the active layer 206 is formed by a second patterning process.

Figure 5D:
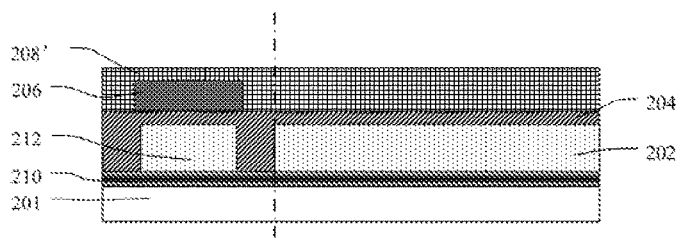
Figure 5E:
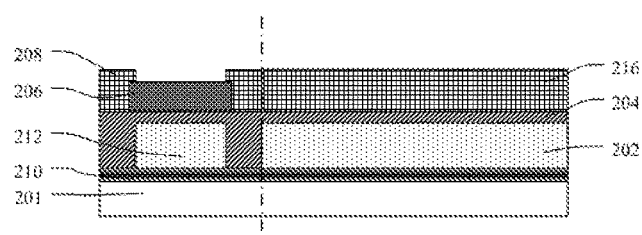

S13: as illustrated in FIG. 5d, a source-drain metal layer film 208' is formed on the active layer 206; and then, as illustrated in FIG. 5e, the data line 208 (comprising the source electrode and the drain electrode) and the shield layer 216 are formed by a third patterning process.

Figure 5F:
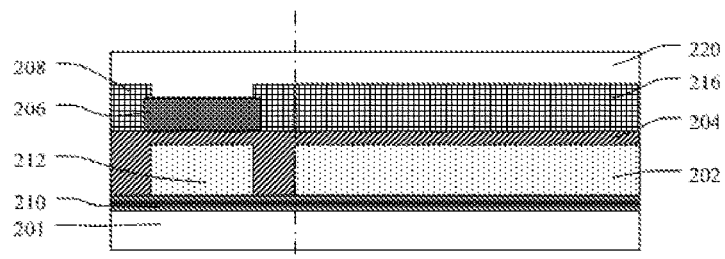

S14: as illustrated in FIG. 5f, an auxiliary layer 220 (comprising a passivation layer, an inter-level dielectric, a buffer layer, a planarization layer, etc.) is further formed on the data line 208 (comprising the source electrode and the drain electrode) and the shield layer 216.

Figure 5G:
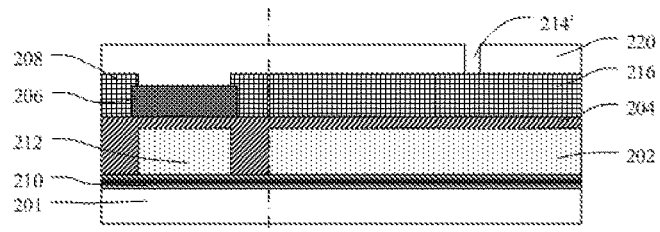

The manufacturing method of the array substrate 200' provided by another embodiment of the disclosure further comprises a step S15 of forming a via. As illustrated in FIG. 5g, a via 214' which passes through the auxiliary layer 220 and is electrically connected with the shield layer 216 is formed on the array substrate 200'. In this way, the common power source can apply the common voltage Vcom to the shield layer 216 through the via 214', to further shield electric fields produced by the gate line. The method of forming the via 214 as illustrated in FIG. 3b can comprises a step of etching the interlayer to make the via 214 to contact with the light shield layer.

A manufacturing method of the array substrate 300 provided by another embodiment of the disclosure comprises steps S21-S24.

S21, as illustrated in FIG. 6a, this step is similar to S11, which will not be repeated.

Figure 6B:
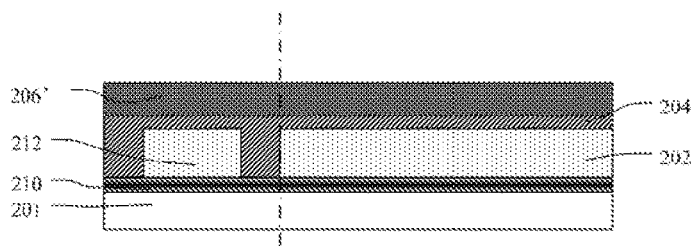
Figure 6C:
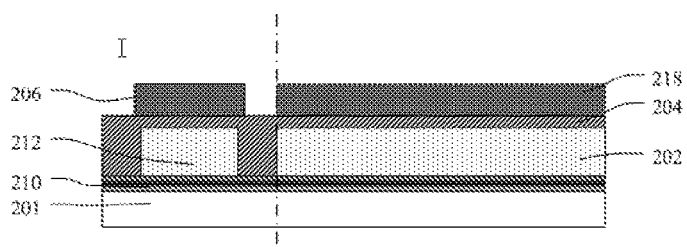

S22: as illustrated in FIG. 6b, an insulation layer 204 and the active thin film 206' are formed on the gate line 202; and then, as illustrated in FIG. 6c, the active layer 206 and the shield layer 218 are formed by a second patterning process. The shield layer 218 is made of a same material as the active layer 206, is provided in a same layer as the active layer 206, covers the gate line 202 in the direction perpendicular to the array substrate 300 and is electrically insulated from the gate line 202, the active layer 206 and the data line 208.

Figure 6D:
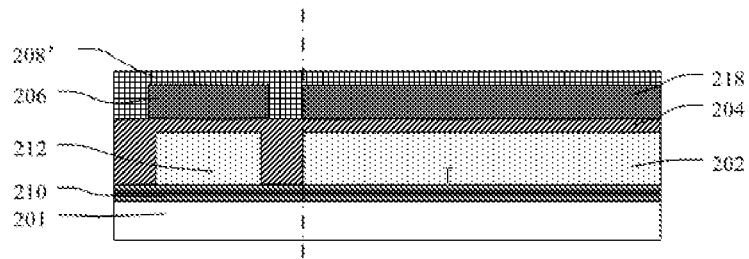
Figure 6E:
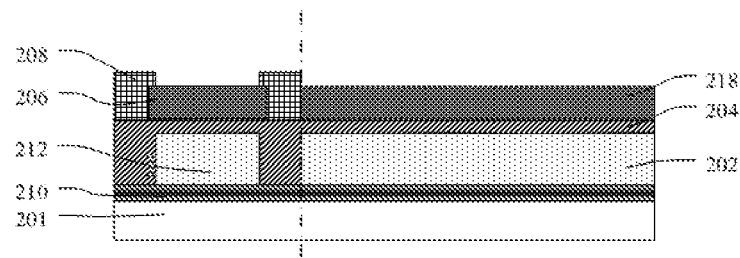

S23: as illustrated in FIG. 6d, a source-drain metal layer thin film 208' is formed on the active layer 206 and the shield layer 218; and then, as illustrated in FIG. 6e, the data line 208 (comprising the source electrode and the drain electrode) is formed by a third patterning process.

Figure 6F:
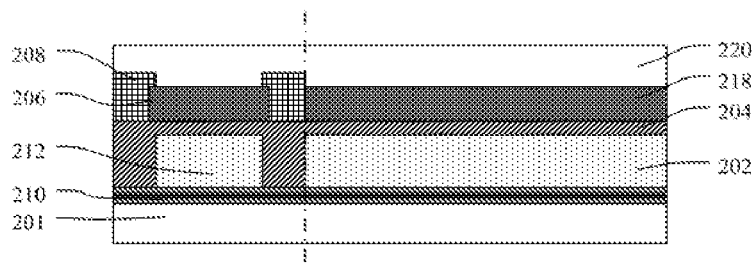

S24: as illustrated in FIG. 6f, an auxiliary layer 220 (comprising a passivation layer, an inter-level dielectric, a buffer layer, etc.) is further formed on the data line 208 (comprising the source electrode and the drain electrode).

Figure 6G:
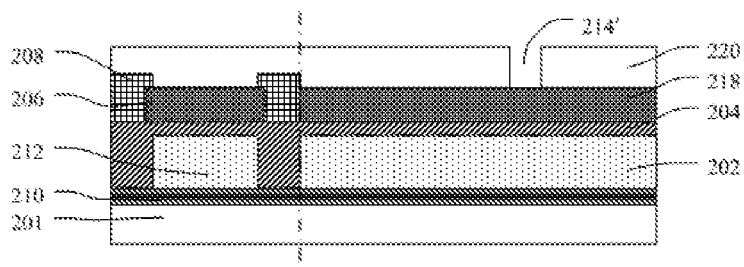

The manufacturing method of the array substrate 200' provided by another embodiment of the disclosure further comprises a step S25 of forming a via. As illustrated in FIG. 6g, a via 214' which passes through the auxiliary layer 220 and is electrically connected with the shield layer 216 is formed on the array substrate 300. In this way, the common power source can apply the common voltage Vcom to the shield layer 218 by the via 214', to further shield electric fields produced by the gate line. The method of forming the via 214 as illustrated in FIG. 3b can comprise a step of etching the interlayer to make the via 214 to contact with the light shield layer.

The embodiment of the disclosure further provides a manufacturing method of the array substrate 400. The manufacturing method can form shield layers 216 and 218 to further shield electric fields produced by gate lines. A description which describes how to form shield layer 216 and 218 has been described in detail above, which will not be repeated.

Another embodiment of the disclosure provides a display panel comprising any of above mentioned array substrates.

Another embodiment of the disclosure provides an electronic device comprising the above mentioned display panel. For example, the electronic device can comprise: a liquid crystal panel, electronic paper, an OLED panel, a cell phone, a tablet computer, a television, a display, a laptop, a digital photo frame, a navigator, a watch and any product or part having display function.

The shield layer are providing above the gate line, so that electronic fields produced by the gate lines will be weakened or even shielded, so as to reduce the effect of the electronic fields produced by the gate line to the displaying.

The foregoing is merely exemplary embodiments of the invention, but is not used to limit the protection scope of the invention. The protection scope of the invention shall be defined by the attached claims.

The application claims priority to the Chinese patent application No. 201610232297.3, filed Apr. 14, 2016, the entire disclosure of which is incorporated herein by reference as part of the present application.

The invention claimed is:

1. An array substrate, comprising a substrate, and a gate line, an insulation layer, an active layer and a data line which are formed on the substrate,
   wherein the insulation layer is provided on the gate line, the data line is provided on the gate line through the insulation layer and is crossed with the gate line, and the active layer is provided between the gate line and the data line in a direction perpendicular to the substrate,
   a first shield layer is provided on the gate line through the insulation layer, and the first shield layer covers the gate line in the direction perpendicular to the substrate and is electrically insulated from the gate line, the active layer and the data line,
   the array substrate further comprises a common electrode layer provided on a side of the data line away from the gate line, wherein the common electrode layer comprises a plurality of striped common sub-electrodes, and adjacent ones of the striped common sub-electrodes are spaced with an interval,
   the first shield layer is configured to be applied with a common voltage, and
   the array substrate further comprises a light blocking layer provided between the substrate and the gate line, wherein, the first shield layer is connected to the light blocking layer by a via.

2. The array substrate of claim 1, wherein the interval extends along a direction the same as a direction along which the gate line extends.

3. The array substrate of claim 1, wherein at least a portion of the gate line is opposed to the interval in the direction perpendicular to the substrate.

4. The array substrate of claim 1, wherein the first shield layer is provided in a same layer as the active layer, and the first shield layer is made of a same material as the active layer.

5. The array substrate of claim 1, wherein the first shield layer is provided in a same layer as the data line, and the first shield layer is made of a same material as the data line.

6. The array substrate of claim 1, further comprising a second shield layer, wherein, the second shield layer is provided above the gate line and is provided in a different layer from the first shield layer, and the second shield layer covers the gate line in the direction perpendicular to the substrate and is electrically insulated from the gate line, the active layer and the data line.

7. The array substrate of claim 1, wherein the light blocking layer is made of molybdenum.

8. A display panel comprising the array substrate of claim 1.

9. An electronic device, comprising the display panel of claim 8.

10. A manufacturing method of an array substrate, the array substrate comprising a substrate and a gate line, an insulation layer, an active layer, a data line provided on the substrate, the manufacturing method comprising:

forming the gate line, the insulation layer, the active layer, and the data line on the substrate in sequence in a direction away from the substrate, and forming a first shield layer above the gate line through the insulation layer, wherein the gate line and the data line are crossed with each other, the first shield layer covers the gate line in a direction perpendicular to the array substrate, and is electrically insulated from the gate line, the active layer and the data line, the manufacturing method comprises forming a common electrode layer on a side of the data line away from the gate line, dividing the common electrode layer into a plurality of striped common sub-electrodes, so that adjacent ones of the striped common sub-electrodes are spaced with an interval, and the manufacturing method comprises forming a light blocking layer between the substrate and the gate line, wherein the first shield layer is connected to the light blocking layer by a via.

11. The method of claim 10, wherein the interval extends along a direction the same as a direction along which the gate line extends.

12. The method of claim 10, wherein at least a portion of the gate line is opposed to the interval in the direction perpendicular to the array substrate.

13. The method of claim 10, wherein, the first shield layer is formed simultaneously with forming the active layer, and the first shield layer is made of a same material as the active layer.

14. The method of claim 10, wherein the first shield layer is formed simultaneously with forming the data line, and the first shield layer is made of a same material as the data line.

15. The method of claim 10, further comprising forming a second shield layer, wherein the second shield layer is provided above the gate line and is provided in a different layer from the first shield layer, and the second shield layer covers the gate line in the direction perpendicular to the substrate and is electrically insulated from the gate line, the active layer and the data line.

* * * * *